United States Patent [19]
Hartmann et al.

[11] 3,990,021
[45] Nov. 2, 1976

[54] SURFACE WAVE MULTIFREQUENCY OSCILLATOR

[75] Inventors: Clinton S. Hartmann; Steven J. Bomba, both of Dallas; Ralph F. Tenny, Richardson, all of Tex.

[73] Assignee: Texas Instruments Incorporated, Dallas, Tex.

[22] Filed: Apr. 2, 1973

[21] Appl. No.: 347,106

[52] U.S. Cl. .............................. 331/177 V; 330/5.5; 331/107 A; 331/179
[51] Int. Cl.² ........................................... H03B 5/32
[58] Field of Search ......... 331/60, 162, 179, 107 A, 331/117 D, 78, 177 R, 177 V, 36 C; 333/30, 72; 330/5.5

[56] References Cited
UNITED STATES PATENTS

| | | | |
|---|---|---|---|
| 2,298,085 | 10/1942 | Koerner | 331/162 |
| 3,518,586 | 6/1970 | Nilssen et al. | 331/179 |
| 3,755,761 | 8/1973 | Hartmann | 333/72 |
| 3,766,496 | 10/1973 | Whitehouse | 331/107 A |
| 3,805,189 | 4/1974 | Zucker et al. | 331/107 A |

*Primary Examiner*—John Kominski
*Attorney, Agent, or Firm*—Harold Levine; James T. Comfort; William E. Hiller

[57] ABSTRACT

A variable frequency VHF or UHF band oscillator is disclosed. Principal control over the precise location and stability of the frequency of oscillation is provided by a surface wave delay line in the regenerative feedback path of a broadband amplifier. The surface wave delay line is capable of passing substantial energy within each of a plurality of very narrow passbands. Controls are provided for ensuring that at any given time the circuit can oscillate only at the resonant frequency of one of these passbands. Selection of the frequency of oscillation is in accordance with an externally applied digital frequency select signal.

9 Claims, 9 Drawing Figures

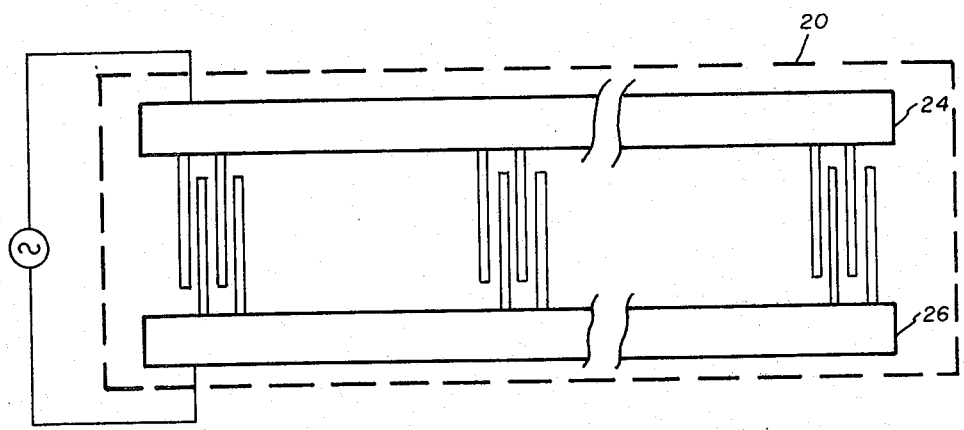
(A) Fig. 3A
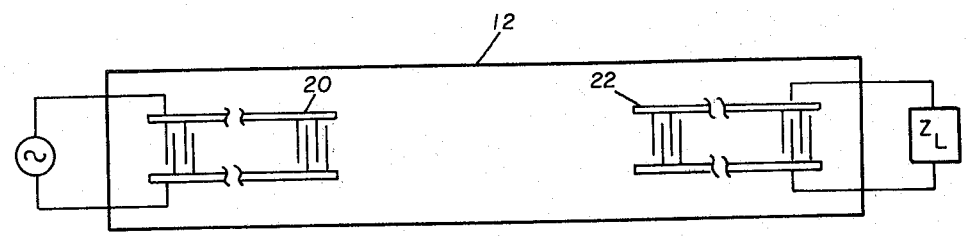
(B) Fig. 3B
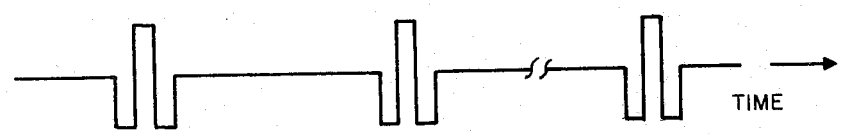
(C) Fig. 3C

SURFACE WAVE MULTIFREQUENCY OSCILLATOR

This invention relates to variable frequency oscillators and more particularly to circuits wherein the frequency of oscillation is controlled by external means.

Externally controlled variable frequency oscillators are well known in the art. The frequency of oscillation of the local oscillator in a radio or television tuner for example is controlled by a dial or channel selector switch. Frequently, these oscillators comprise an amplifier and a frequency selective regenerative feedback path around the amplifier. The frequency of oscillation is established by controlling the resonant frequency of the feedback path. More recently, it has been discovered that the frequency selective feedback path may comprise a surface wave delay line. The use of the surface wave delay line is advantageous in that the required high degree of frequency selectivity can be achieved in the UHF and VHF ranges with simple circuits. Such an oscillator is the subject of copending application Ser. No. 301918, filed Oct. 30, 1972, also assigned to the same assignee. The present invention relates to controlling the frequency of oscillation of a surface wave delay line oscillator.

Briefly this invention contemplates an oscillator in which the feedback path surface wave delay line has a frequency response characteristic similar to that of a comb filter. By this it is meant that the amplitude response of the surface wave delay line has a plurality of very narrow passbands separated by substantial frequency bands where significant attenuation of the input occurs. As a result, amplifier output signals occurring at any frequency which lies within one of the passbands of the surface wave delay line will be fed back by the delay line. The oscillator is capable of functioning at any of the resonant frequencies of the surface wave delay line. Selection of one of these frequencies of oscillation is accomplished by a second bandpass filter placed in cascade with the surface wave delay line in the feedback path. This filter may have a relatively broad passband. Its bandwidth need only be sufficiently narrow to ensure that it does not pass sufficient energy to permit oscillation at frequencies other than that of the desired resonant peak of the surface wave delay line. It has the additional feature of being tunable over the operational frequency range of the surface wave delay line. That is, its center frequency can be shifted by external signals so as to cause it to overlap the desired resonant frequency of the surface wave delay line. Under these circumstances it will be understood that the oscillator can only oscillate at the oscillator resonant frequency of the surface wave delay line which coincides with the resonant frequency of the tunable filter. The frequency of oscillation may be selected to occur exactly at the resonant peak of the surface wave delay line or on the skirt of the delay line resonant peak.

The tunable bandpass filter is controlled by a logic circuit which is in turn responsive to digital input signals indicative of the desired frequency of oscillation. In this way it is ensured that the center frequency of the variable bandpass filter will coincide with the resonant peak of the surface wave delay line at which oscillation is desired.

In a different embodiment of this invention, the tunable filter is placed in a degenerative feedback path around the amplifier. In this case, the filter will have a notch frequency response characteristic. As a result, the amplifier/tunable filter combination will have a closed loop frequency response which passes energy only within a very narrow passband. When the regenerative feedback path including the surface wave delay line filter is closed around this combination the circuit will be capable of sustaining oscillations only at that resonant frequency of the surface wave delay line which coincides with the resonant frequency of the closed loop amplifier. Again, the frequency of the notch in the tunable filter is controlled by a logic circuit which is in turn responsive to digital input signals indicative of the desired frequency of oscillation.

In still a third embodiment of the invention a different type of surface wave delay line filter is incorporated in the regenerative feedback path. This filter has only one very narrow passband with sufficient response to sustain oscillation. The location of this passband, however, is selectable by means of semiconductor switches associated with the delay line from a plurality of predetermined allowable resonant frequencies. Signals from a logic circuit control the semiconductor switches and thereby select the frequency of oscillation in accordance with the digital input signals.

Certain advantages of this invention stem from the use of surface wave delay line filters in the regenerative feedback path. Surface wave delay lines can be produced with close control over the electrical parameters of the device. As a result, alignment techniques required with discrete component mechanically switched frequency selective circuits are not necessary with surface wave delay line filters. Moreover, excellent temperature stability is achieved with the delay line filters.

The invention, however, is not restricted to embodiments using a surface wave delay line device. The invention can also be practiced with other devices having frequency response characteristics similar to those of the surface wave delay lines disclosed.

Other objects, features, and advantages will become apparent from the following detailed description when taken in connection with the appended claims and the accompanying drawings in which FIG. 1 is a block diagram of a surface wave multi-frequency oscillator;

FIG. 3A is an expanded diagrammatic view of an interdigital transducer;

FIG. 3B is a diagram of a surface wave delay line employing input and output interdigital transducers of the type shown in FIG. 3A;

FIG. 3C is a diagram showing the impulse response of the input or output interdigital transducer of the surface wave delay line shown in FIG. 3B;

Figure 6:
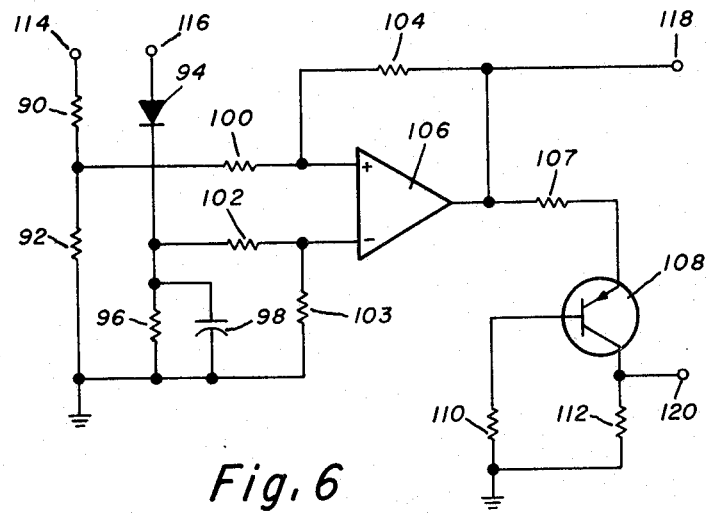
Figure 5:
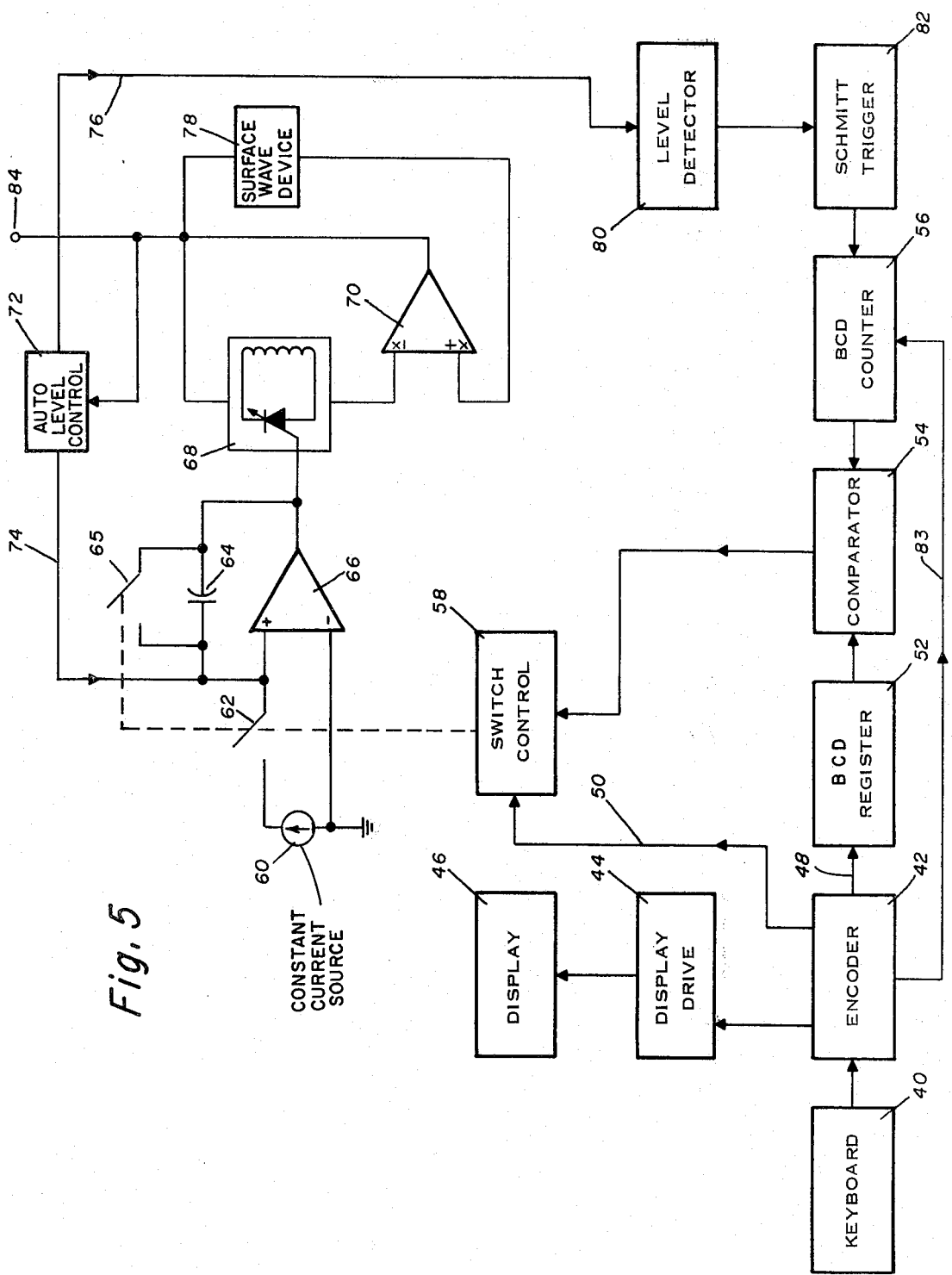

FIGS. 4(a)–(e) show Fourier transforms relevant to the surface wave delay line;

FIG. 5 is a block diagram showing a digital control apparatus;

FIG. 6 is a circuit diagram showing an automatic level control circuit.

Figure 1:
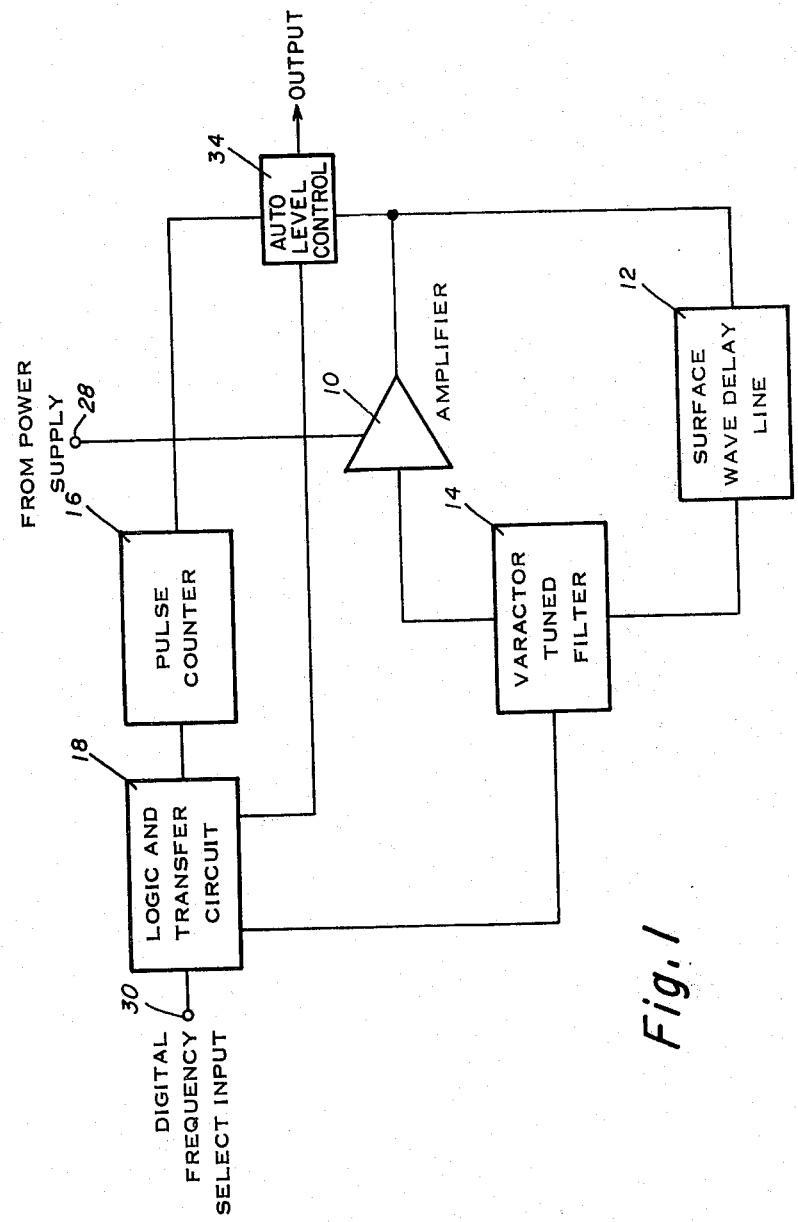

FIG. 1 shows a block diagram of the surface wave multi-frequency oscillator. It includes a broadband amplifier 10 which is energized by an external power supply 28. The output of the amplifier 10 is directed through automatic level control (ALC) 34 and is also fed back to a surface wave delay line 12. The output from the ALC 34 constitutes the output of the oscillator. The output of the surface wave delay line is connected to a varactor tuned filter 14 whose output is connected to the input of the amplifier 10. The ALC 34 is also connected to a pulse counter 16 whose output in turn is one input to logic and transfer circuit 18. The second input to logic and transfer circuit 18 is an externally applied digital signal from a digital frequency select signal source 30. The output of logic and transfer circuit 18 forms an input to the varactor tuned filter 14.

Figure 2A:
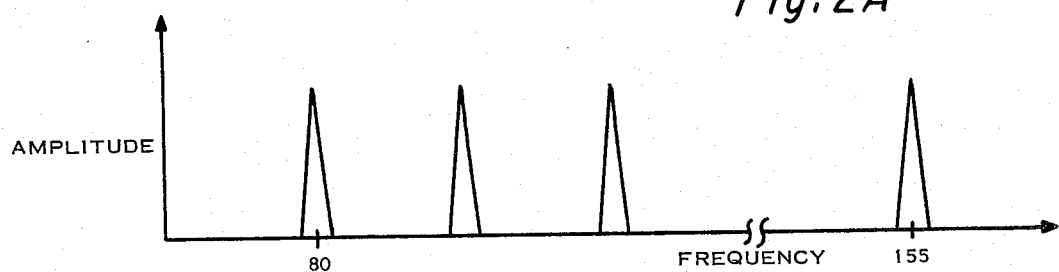
FIG. 2A shows a surface wave delay line amplitude response.

The amplifier 10 will have a relatively flat response throughout the operational frequency range of the oscillator. A typical amplitude response of the surface wave delay line 12 is illustrated in FIG. 2A. It consists of a plurality of very narrow passbands separated by relatively broad stop bands. In this embodiment, the center frequencies of the passbands are equispaced at intervals of 7.5mHz and cover the range 80 mHz to 155 mHz. It will be understood that this specific configuration is illustrative only. Any spacing of passbands equidistant or not and any frequency range falling within the operational capabilities of surface wave delay lines is within the contemplation of this invention.

Figure 2B:
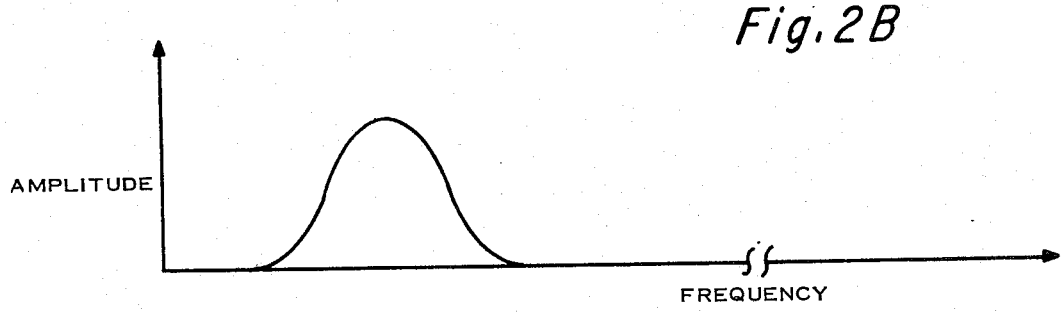
FIG. 2B shows a varactor tuned filter amplitude response.

A typical frequency response of the varactor tuned filter 14 is illustrated in FIG. 2B. It will be noted that the bandwidth of this device is considerably greater than that of any of the resonant peaks of surface wave detector 12. In response to input signals from the logic and transfer circuit 18, the center frequency of the varactor tuned filter 14 is caused to increase or decrease. In this way, its resonant frequency can be made equal to the frequency of any of the resonant peaks of the surface wave detector 12. Varactor tuned filters of this type are well known in the art. It will be understood that the use of a varactor tuned filter is not critical to the practice of this invention. It may be replaced by any type of filter with a suitable amplitude response and whose resonant frequency can be varied over the required range in response to the output of the logic and transfer circuit 18. The bandpass characteristics required of the varactor tuned filter 14 are relatively modest. Its bandpass need only be sufficiently narrow to ensure that at the frequency of the desired peak of the surface wave delay line 12, the gain of the varactor tuned filter 14 is 6 db higher than at the frequencies of any of the other peaks of the surface wave delay line 12.

The characteristics of the varactor tuned filter 14 and the logic and transfer circuit 18 are such that the resonant frequency of the varactor tuned filter 14 will at all times coincide with one of the resonant frequencies of the surface wave delay line 12 or with a skirt of the surface wave delay line resonant peak. Assuming that amplifier 10 has sufficient gain to compensate for the insertion loss of surface wave delay line 12 and the varactor tuned filter 14, the circuit will then oscillate at this specific resonant frequency of the surface wave delay line 12. Thus, it is seen that approximate selection of the frequency of oscillation is provided by the varactor tuned filter 14. Precise selection of the frequency of oscillation and stability thereof is provided by the sharp bandpass characteristics of the surface wave delay line 12. The effective bandwidth of these resonant peaks may typically be as small as 100 kHz. The exact frequency of oscillation is dependent upon the phase response of the delay lines since a loop phase shift of 0° is one of the requirements for oscillation. The steep phase response of the delay line results in high frequency stability.

One means for causing the resonant frequency of the varactor tuned filter 14 to conform to the desired oscillator frequency as expressed by the digital frequency select input signal is as follows: The input signal is representative of a number ranging from zero to N-1 wherein N is the number of possible frequencies of oscillation for the oscillator.

Upon the reception of a new input signal, the logic and transfer circuit 18 causes the resonant frequency of the varactor tuned filter 14 to lie below the frequency of the lowest resonant peak of the surface wave delay line 12. At the same time, pulse counter 16 is reset to 0. The logic and transfer circuit 18 compares the number represented by the digital frequency select input signal with the ouput of the pulse counter 16. If these numbers are not in agreement the logic and transfer circuit 18 applies a signal to varactor tuned filter 14 causing its resonant frequency to increase. When its resonant frequency coincides with that of the first resonant peak of the surface wave delay line 12, the circuit will burst into oscillation at this frequency. The transition from non-oscillating to oscillating status will cause an output from ALC 34 to the pulse counter 16. The output will be sensed by pulse counter 16 and its output count will increase to one. This process continues until the count of pulse counter 16 is in agreement with the number represented by the input signal. At this time, the oscillator will be functioning at the desired frequency and the frequency increase signal provided to the varactor tuned filter 14 will be terminated. Again, this specific embodiment of the logic and transfer circuit 18 is not crucial to the practice of this invention. Other means for varying the resonant frequency of the varactor tuned filter 14 in response to the digital frequency select input signal are within the contemplation of the invention. The logic and transfer circuit 18, for example, might simply have N discrete output voltage levels each corresponding to one of the different numbers represented by the digital frequency select input signal. The varactor tuned filter 14 might be so structured so that in response to any of these discrete voltage levels its resonant frequency will coincide with one of the resonant frequencies of the surface wave delay line 12. In this way, the digital input signal would directly select the correct resonant frequency for the varactor tuned filter 14 and the pulse counter 16 would no longer be needed. Moreover, the signals used to step the pulse counter 16 can be obtained at any point in the circuit where the onset of oscillation causes a transient or other signal.

It is also possible to practice the invention with the varactor tuned filter or an equivalent in a degenerative feedback path around the amplifier rather than in the regenerative feedback path. In this case, the varactor tuned filter would be a notch filter. The amplifier/tuned filter combination closed loop frequency response will have sufficient gain to support oscillations only at a narrow band of frequencies centered about the notch frequency of the varactor tuned filter. When this frequency coincides with the frequency of one of the resonant peaks of the surface wave delay line, still in the regenerative feedback path, the circuit will be capable of oscillation. Again, by varying the location of the notch frequency of the varactor tuned filter it is possible to select the frequency of one of the resonant pulses of the surface wave delay line as the frequency of oscillation.

An understanding of the surface wave delay line 12 may be had by reference to FIGS. 3A-3C and 4(a)-4(e), and to a standard text on Fourier analysis such as *Fourier Transforms and Convolutions for the Experimentalist* by R. C. Jennison, Pergamon Press, 1961. FIG. 3B shows a schematic illustration of the surface wave delay line 12. It consists of a piezoelectric substrate on which are mounted two interdigital transducers. The input interdigital transducer 20 is excited by an external signal means. Electric signals impressed upon the input interdigital transducer 20 excite acoustical Rayleigh waves in the substrate which propagate in the direction of the output transducer 22. These acoustical signals are reconverted to electrical signals by the output interdigital transducer 22 and coupled to a load $Z_L$. In this particular configuration, the geometries of the two interdigital transducers 20, 22 are identical, although this is not a requisite to a practice of the present invention. An expanded view of the input interdigital transducer 20 is illustrated in FIG. 3A. It includes conductor bars 24 and 26 which extend along the length of the transducer. A plurality of fingers extends from each of these conductor bars. In this particular configuration, the fingers are clustered in groups of four, each of such groups constituting a single tap of the transducer. There are 32 of these taps equispaced along the length of the transducer. When an external electric signal is impressed on the conductor bars 24 and 26, there will result electric fields between the fingers of each tap. As a result of the piezoelectric nature of the substrate, these electric fields induce corresponding strains upon the surface of the substrate underlying the tap. These strains then propagate away from the tap in the form of acoustic Rayleigh waves. The Rayleigh waves of interest here are those which propagate to the right, that is, in the direction of the output interdigital transducer 22. Since the fingers of a given tap are alternately connected to the upper and lower conductor bars 24 and 26, it will be seen that when the signal voltage is impressed upon these conductor bars, the strains induced between adjacent pairs of fingers will be opposite in direction. To determine the impulse response of the transducer to substrate coupling, one conceptually applies an electric impulse function from the external source and considers the wave form of the resultant Rayleigh waves as they pass a point to the right of the transducer. The resultant waveform for this particular transducer configuration is illustrated in FIG. 3C. It is seen that this waveform consists of a plurality of pulses, each pulse consisting of two negative going excursions and one positive going excursion. The form of these pulses results from the fact that each tap of the transducer contains three interfinger areas in which strains of opposite direction are induced by the impulse. The time spacing between the pulses results from the fact that the distance from each of the taps to the point at which the Rayleigh wave is being monitored differ. The waveform of FIG. 3C then is the impulse response of the transducer to substrate coupling.

The frequency response corresponding to this impulse response will be understood with reference to the diagrams of FIGS. 4(a)–(e). In these figures, the illustrations of the left-hand column represent time domain quantities, while the illustrations of the right-hand column illustrate frequency domain quantities. In FIG. 4(a), is shown a time domain function which consists of an infinite series of impulse functions. Any two adjacent impulse functions are separated by a time $d_1$. The Fourier transform of this function represented in the right-hand side of the figure is also an infinite series of impulse functions. Here the spacing between adjacent impulses is a frequency difference of $$\frac{1}{d_1}.$$

Figure 4:
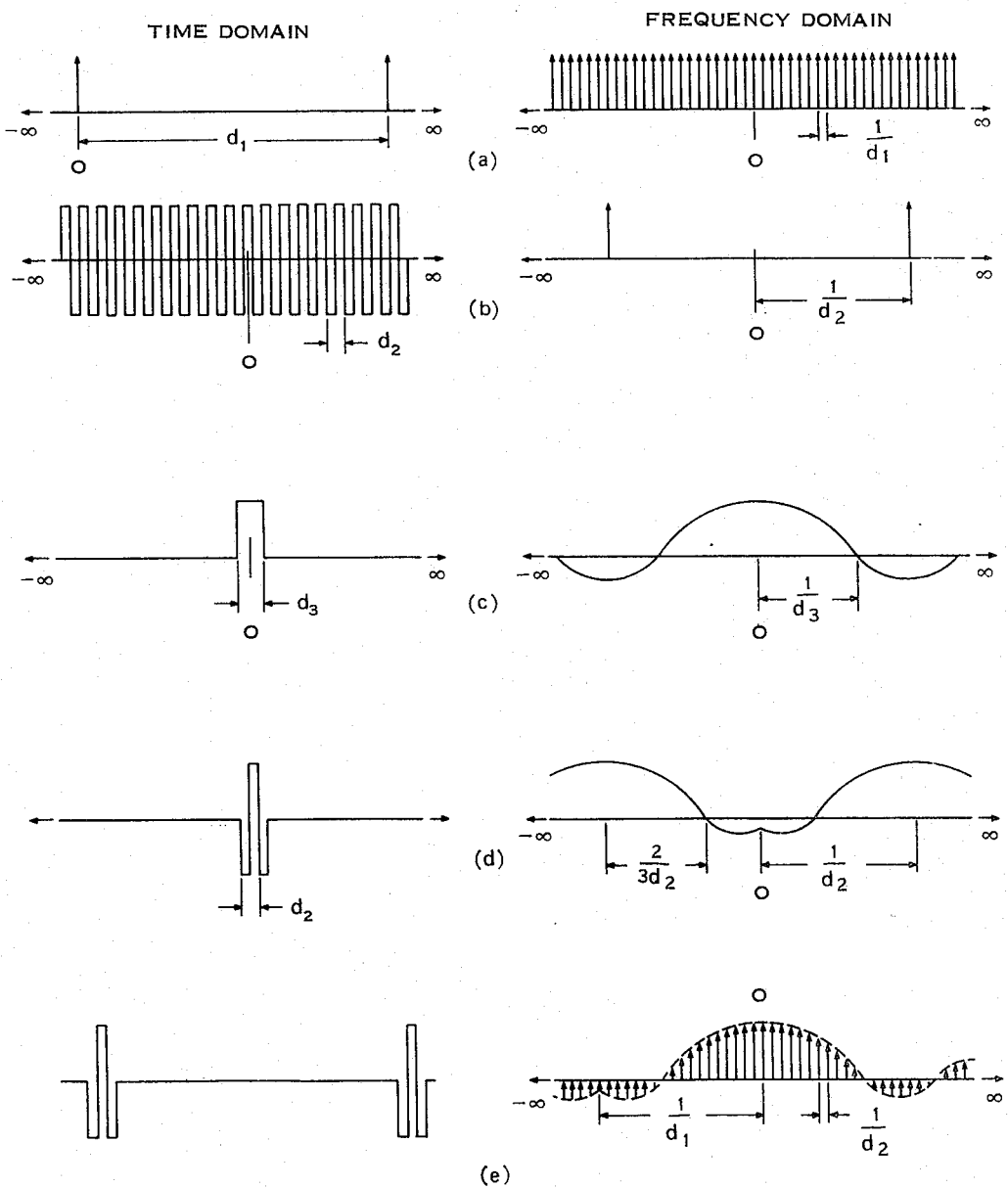

To the extent that the pulses in the impulse response function of FIG. 3C can be represented as impulse functions, this frequency domain quantity could then be thought of as a first approximation to the transfer function of the transducer to substrate coupling. More accurate results must take into account the precise nature of the pulses in the impulse function. One of these pulses is reproduced as time domain function of FIG. 4(d). This pulse can be regarded as the product of the infinite length squarewave shown in FIG. 4(b) and the gate function shown in FIG. 4(c). Since multiplication in the time domain corresponds to convolution in the frequency domain, it is seen that the Fourier transform of the pulse of FIG. 4(d) must be the convolution of the Fourier transforms of the squarewaves and the gate function. As is well known in the theory of Fourier analysis, the infinite length square wave of FIG. 4(b) has a Fourier transform which consists of a plurality of impulse functions modulated by a sin $x/x$ function envelope. That portion of this Fourier transform in the frequency range of interest is illustrated in the right-hand side of FIG. 4(b). Similarly, the Fourier transform of the gate function is the sin $x/x$ function illustrated in the right-hand side of FIG. 4(c). The convolution of these two Fourier transforms give rise to the Fourier transform of the pulse illustrated in the right-hand side of FIG. 4(d). Now, the impulse response shown in FIG. 3C and reproduced in the left-hand side of FIG. 4(e) can be regarded as the time domain convolution of the functions shown in FIG. 4(a) and FIG. 4(d). Again, since time domain convolution corresponds to frequency domain multiplication, the Fourier transform of the impulse response is the product of the frequency domain responses of FIG. 4(a) and FIG. 4(d). A portion of this Fourier transform is shown with the frequency axis expanded in the right-hand side of FIG. 4(e). It is seen to be a periodic series of impulse functions modulated by a sin $x/x$ function whose maximum value occurs at a frequency distance of $$\frac{-1}{d_2}$$

from the origin. The impulses of articular significance in this invention are those lying within the major lobe of the sin $x/x$ function. As mentioned previously, the general location of this major lobe along the frequency axis is controlled by the time $d_2$. The frequency spacing between adjacent impulses is seen to be controlled by the time $d_1$. Comparison of FIGS. 3 and 4 shows that the time $d_2$ is determined by the spacing between fingers within a tap along with the acoustic propagation velocity of the substrate, while the time $d_1$ is controlled by the spacing between adjacent taps along with the propagation velocity of the substrate. By selection of these distances, it is possible to control the frequency range in the transfer function wherein impulse functions of substantial amplitude occur and also the frequency spacing between adjacent impulses within this range. There is yet one other modification of the transfer function of FIG. 4(e) to be considered. Up to this point, the time domain function of FIG. 4(a) has been considered to be infinite in extent. In reality, the impulse response to FIG. 4(c) consists of only a finite number of pulses. It is appropriate therefore to consider the impulse train of FIG. 4(a) to consist of only a finite number of impulses. This has the effect of converting each of the impulses in the frequency domain quantity of FIG. 4(a) to a very narrow sin $x/x$ function. The width of the main lobe of each of these sin $x/x$ functions is controlled by the time $d_3$, that is, by the total width of each of the taps in the interdigital transducer. This effect is carried directly over to the transfer function of FIG. 4(e). This feature allows control over the width of each of the sharp bandpasses existing in the transfer function of FIG. 4(e).

Subject to this modification, the Fourier transform of FIG. 4(e) represents the transfer function of the input interdigital transducer 20 to substrate coupling. It yet remains to consider the corresponding transfer function for the substrate to output interdigital transducer 22 conversion. As pointed out above, the input and output transducers 20, 22 have identical configurations since the system here is one to which the principle of reciprocity applies. As a result, the transfer function of the substrate to output transducer 22 conversion is identical to that of the input transducer 20 to substrate conversion. The total system then consists of these two conversions in cascade. It follows that the transfer function of the overall system is simply the product of the two individual transfer functions. Formation of this product does not disturb the location of the passbands in the individual transfer functions but has the effect of sharpening each of these bands. The amplitude response of the overall combination therefore is that represented in FIG. 2A. It is to be noted that by modifying the spacing of the individual fingers of the interdigital transducers and the number of these fingers, the overall response represented by FIG. 2A can be modified. Such modification also includes, but is not limited to, varying the overlap between the various fingers of the transducer. Such modifications are within the contemplation of this invention.

A critical feature of the surface wave delay line is its phase response. Since the phase of the surface wave delay line varies more rapidly with frequency than does the phase of any other element in the oscillator loop, the frequency of oscillation is established precisely by the phase of the surface wave delay line as is the stability of the frequency of oscillation. As shown in copending U.S. patent application Ser. No. 301,918, filed Oct. 30, 1972, the phase slope of the delay line is a function of the spacing between the centers of the input and output interdigital transducers. Thus, by properly selecting this spacing it is possible to achieve the desired phase slope.

FIG. 5 shows a more detailed block diagram of the pulse counter 16 and the logic and transfer circuit 18 of FIG. 1. Here a keyboard 40 provides digital signals to an encoder 42. The encoder, in turn, drives display drive 44 and display 46. The encoder 42 is also connected to BCD register 52 and to switch control 58 by means of lines 48 and 50, respectively. Encoder 42 has a fourth output connected by line 83 to the BCD counter 56. A signal from BCD register 52 is one input to comparator 54 which in turn provides a second input to switch control 58. Switch control 58 drives semiconductor switch 65 and semiconductor switch 62 which, when closed, connects constant current source 60 to the positive input of operational amplifier 66. Capacitor 64 is in the regenerative feedback loop of operational amplifier 66. The output of operational amplifier 66 is connected to the varactor of varactor tuned circuit 68. This varactor tuned circuit 68 is connected in the degenerative feedback path of operational amplifier 70 while a surface wave device 78 is connected in the regenerative feedback path of the amplifier 70. The output of the amplifier 70 forms the output of the tuned oscillator 84 and is also connected to automatic level control (ALC) 72. An output from ALC 72 on line 74 is connected to the positive input of operational amplifier 66. A second output of ALC 72 is connected through line 76 to level detector 80 which in turn supplies an input to Schmitt trigger 82. The output from the Schmitt trigger is connected to BCD counter 56 which, in turn, provides the second input to comparator 54.

Operationally, a channel is selected by depressing two keys on keyboard 40 representing the two-digit number of the desired channel. The tuning sequence is initiated by depressing a "Tune" key, also on keyboard 40. The resulting digital signal is transferred to encoder 42 where it is reformatted to be compatible with the input of display drive 44. Display drive 44 then causes the two-digit number to be reflected in display 46. Encoder 42 also reformats the two-digit channel number into BCD form and this BCD number is conveyed by line 48 to BCD register 52. At this time, encoder 42 also transmits a signal on line 83 which resets BCD counter 56 to 0. Finally, encoder 42 transmits a signal on line 50 to switch control 58 which, in turn, momentarily closes switch 65 thereby shorting out the charge on capacitor 64 and also closes switch 62. At this instant, before the current from constant current source 60 can begin to charge capacitor 64, the output of operational amplifier 66 will be at zero volts. It is assumed for purposes of this discussion that under these conditions the varactor tuned circuit 68 will be tuned to a frequency below any of the resonant peaks of surface wave device 78. The current from constant current source 60 will cause charging of capacitor 64 thereby resulting in a linear increase with time of the voltage at the output of operational amplifier 66. In accordance with this increasing output voltage, the resonant frequency of varactor tuned filter 68 will increase.

When the resonant frequency of varactor tuned filter 68 coincides with the lowest resonant frequency of surface wave delay line 78, the oscillator will oscillate. This oscillation causes an increased dc level at the output of ALC 72 which is connected by means of line 76 to level detector 80. The level detector 80 converts this dc level to a form acceptable to Schmitt trigger 82. The resultant dc level from level detector 80 causes the Schmitt trigger 82 to flip thereby providing a pulse which increments the count of BCD counter 56. The contents of BCD register 52 are compared with those of BCD counter 56 by comparator 54. When there is disagreement, there is no response from comparator 54 and constant current source 60 continues to charge up capacitor 64. This results in continued increase of the resonant frequency of varactor tuned filter 68. Each time the resonant frequency of the tuned filter 68 passes through one of the resonant frequencies of surface wave device 78, there results an increase in the count of BCD counter 56. This continues until agreement occurs between the contents of BCD register 52 and BCD counter 56. At this time, comparator 54 transmits a signal to switch control 58 which, in turn, opens switch 62. At this time, the resonant frequency of varactor tuned filter 68 will coincide with the desired resonant frequency of surface wave delay line 78 and the oscillator will be functioning at the desired channel frequency. There is a tendency however, for the charge on capacitor 64 to leak off and means must be provided for maintaining the charge on this capacitor. ALC circuit 72 has a second output which is a current source proportional to the amplitude of the level of oscillation of amplifier 70. In other words, as the aplitude of the oscillations of amplifier 70 decreases, the current in line 74 will increase. The direction of this current is toward the positive input of operational amplifier 66. The level detector 80 is adjusted so as to cause Schmitt trigger 82 to pulse BCD counter 56 at a time slightly before the resonant frequency of varactor tuned filter 68 reaches the desired resonant frequency of surface wave delay line 78, and switch 62 opens at this time. Since varactor tuned filter 68 has not yet reached the proper resonant frequency, the amplitude of oscillations is less than the nominal value. ALC circuit 72 injects current into the positive input of amplifier 66, thereby increasing the resonant frequency of varactor tuned filter 68. When the proper resonant frequency is reached, the oscillator functions at its nominal value and the current injected by ALC circuit 72 is cut off. The feedback path consisting of ALC circuit 72 and operational amplifier 66 along with its associated capacitor 64 serves to lock the resonant frequency of varactor tuned filter 68 at a point just slightly below the center frequency of the desired resonant peak of surface wave delay line 78.

ALC circuit 72 is shown in greater detail in FIG. 6. Here a reference voltage is established by dc voltage source 114 along with resistors 90 and 92. The output of the oscillator is connected to input 116. Oscillations appearing at input 116 are converted to a second dc reference voltage by the half wave rectifier consisting of diode 94, resistor 96 and capacitor 98. These two reference voltages are connected to the positive and negative terminals of operational amplifier 106 through resistors 100 and 102. Resistor 104 is connected in a regenerative feedback path around operational amplifier 106. The half wave rectifier consisting of diode 94, resistor 96 and capacitor 98 develops a second dc reference voltage as a function of the amplitude of the oscillations appearing at input 116. The amplitude of the first reference voltage appearing between resistors 90 and 92 is selected to be equal to the amplitude of the second reference voltage when the oscillator is functioning at its nominal amplitude level. If the center frequency of varactor tuned filter 68 is not sufficiently close to the center frequency of the desired resonant peak of surface wave delay line 78, it will be understood that the amplitude of oscillation will be below this nominal level of oscillation. Under these conditions, the second reference voltage appearing at the junction between resistor 96 and capacitor 98 will be less than the level of the first reference voltage appearing at the junction between resistors 90 and 92. The voltage occurring at the output of amplifier 106 will be positive thereby turning on transistor 108 and injecting current into output 120. This current connected by line 74 to the positive input of operational amplifier 66 will cause the voltage at the output of this amplifier to increase, thereby increasing the resonant frequency of varactor tuned filter 68.

In this discussion of the logic circuits, the varactor tuned filter 68 has been assumed to be in the degenerative feedback loop around amplifier 70. The same logic circuits may be employed when the varactor tuned filter 68 is in cascade with the surface wave delay line 78 in the regenerative feedback loop around the amplifier.

Inherent in this invention is the utilization in the oscillator regenerative feedback path of a surface wave delay line which is capable of passing energy within each of a plurality of narrow discrete passbands and for confining the frequency of oscillation at any given time to frequencies lying within one of these narrow passbands. There is an alternative method of implementing this concept. Copending U.S. patent application Ser. No. 214,362 filed Dec. 30, 1971, now U.S. Pat. No. 3,755,761 issued Aug. 28, 1973, discloses a surface wave transversal frequency filter. In this device, the interconnections of the various fingers of the interdigital transducers are determined by means of a semiconductor switching network. For any possible setting of the switching network, the frequency response of the surface wave delay line will be sharply bandpassed. The center frequency of this sharp bandpass is selected by appropriately setting the switches of the switching network. It is possible to design the interdigital transducers and associated switching network so as to make the device capable of passing energy at any of the desired frequencies of oscillation of the present invention. Such a surface wave filter could be used as the surface wave delay line 12 of FIG. 1. In this case, the varactor tuned filter 14 would no longer be necessary.

Still another type of switchable bandpass filter is disclosed in copending U.S. patent application, Ser. No. 347,115, filed Apr. 2, 1973. This device also is capable of passing energy lying within a plurality of very narrow bandpass regions. It inclues a switching network by means of which one of these bandpass regions can be selected to the relative exclusion of the others. It too can be used as the surface wave delay line 12 of FIG. 1.

If either of these switachable bandpass filters are used in the oscillator regenerative feedback path, the logic circuits of FIG. 5 are simplified. In this case, encoder 42 in response to the digital signals supplied by keyboard 40 generates control signals which directly operate the switching network of the surface wave delay line. By closing the appropriate switches of the switching network, the desired resonant frequency is selected.

There has been disclosed herein a multi-frequency oscillator including an amplifier with a surface wave delay line in its regenerative feedback path. This surface wave delay line is capable of passing substantial energy lying within a plurality of very narrow passbands. The frequency of oscillation is selected in accordance with signals developed by a keyboard control.

What is claimed is:
1. A variable frequency oscillator comprising:
   a broadband amplifier operatively responsive to a source for producing an electrical output, a regenerative feedback loop electrically coupling the output of said amplifier to the input thereof, an acoustic surface wave delay line multi-resonant filter disposed in said feedback loop and having an amplitude response over an operational frequency range containing a plurality of discrete narrow band resonant peaks respectively separated by substantial frequency bands where significant signal attenuation occurs, and tuning means having a relatively broad passband as compared to a single narrow band resonant peak of said acoustic surface wave delay line filter, said tuning means being disposed in said feedback loop between said surface wave delay line filter and the input of said amplifier and being tunable over the operational frequency range of said surface wave delay line filter for selecting a frequency of oscillation corresponding to one of said narrow band resonant peaks included in the aplitude response of said surface wave delay line filter, thereby determining the oscillation frequency of the variable frequency oscillator.

2. A variable frequency oscillator as set forth in claim 1, further including control means operably associated with said tuning means for regulating said tuning means to select a frequency of oscillation corresponding to said one narrow band resonant peak included in the amplitude response of said surface wave delay line filter in response to a digital frequency select input signal.

3. A variable frequency oscillator as set forth in claim 1, wherein said tuning means comprises a bandpass filter having a variable resonant frequency.

4. A variable frequency oscillator as set forth in claim 1, wherein said tuning means comprises a varactor tuned filter.

5. A variable frequency oscillator comprising:
a broadband amplifier operatively responsive to a source for producing an electrical output,
a regenerative feedback loop electrically coupling the output of said amplifier to the input thereof,
an acoustic surface wave delay line multi-resonant filter disposed in said regenerative feedback loop and having an amplitude response containing a plurality of narrow band resonant peaks,
a degenerative feedback loop electrically coupling the output of said amplifier to the input thereof,
tuning means comprising a notch filter disposed in the degenerative feedback loop, and
control means operatively associated with said notch filter for regulating said notch filter to select a notch frequency corresponding to one of said narrow band resonant peaks included in the amplitude response of said surface wave delay line filter in response to a digital frequency select input signal, thereby determining the oscillation frequency of the variable frequency oscillator.

6. A variable frequency oscillator comprising:
a broadband amplifier operatively responsive to a source for producing an electrical output,
a regenerative feedback loop electrically coupling a portion of the output of said broadband amplifier to the input thereof, said regenerative feedback loop including an acoustic surface wave delay line multi-resonant filter whose amplitude response contains a plurality of distinct narrow band resonant peaks, varactor tuned filter means having a variable resonant frequency for electrically coupling the energy passed by one of said narrow band resonant peaks to the input of said broadband amplifier,
means for producing a digital frequency select input signal, and
selector means for selecting the resonant frequency of said varactor tuned filter means in response to said digital frequency select input signal, said selector means comprising:
a pulse counter, said pulse counter being responsive to signals occurring in the circuit of said variable frequency oscillator when oscillation begins so as to increment its count by one with the onset of each new oscillation,
initiate means to reset the count of said pulse counter to zero and to set the resonant frequency of said varactor tuned filter means to a frequency below the lowest resonant peak of said plurality of distinct narrow band resonant peaks, and
a comparator for testing agreement of the count of said pulse counter with said digital frequency select input signal and causing the resonant frequency of said varactor tuned filter means to increase when disagreement exists.

7. A variable frequency oscillator comprising:
a broadband amplifier operatively responsive to a source for producing an electrical output,
a regenerative feedback loop electrically coupling a portion of the output of said broadband amplifier to the input thereof, said regenerative feedback loop including an acoustic surface wave delay line multi-resonant filter whose amplitude response contains a plurality of distinct narrow band resonant peaks,
varactor tuned filter means having a variable resonant frequency for electrically coupling the energy passed by one of said narrow band resonant peaks to the input of said broadband amplifier,
means for producing a digital frequency select input signal, and
selector means for selecting the resonant frequency of said varactor tuned filter means in response to said digital frequency select input signal, said selector means comprising:
a pulse counter, said pulse counter being responsive to signals occurring in the circuit of said variable frequency oscillator when oscillation begins so as to increment its count by one with the onset of each new oscillation,
initiate means to reset the count of said pulse counter to zero and to set the resonant frequency of said varactor tuned filter means to a frequency above the highest resonant peak of said plurality of distinct narrow band resonant peaks, and
a comparator for testing agreement of the count of said pulse counter with said digital frequency select input signal and causing the resonant frequency of said varactor tuned filter means to decrease when disagreement exists.

8. A variable frequency oscillator comprising:
a first broadband amplifier operatively responsive to a source for producing an electrical output,
a regenerative feedback loop electrically coupling the output of said first amplifier to the input thereof,
an acoustic surface wave delay line multi-resonant filter disposed in said regenerative feedback loop and having an amplitude response containing a plurality of narrow band resonant peaks, a degenerative feedback loop electrically coupling the output of said first amplifier to the input thereof, tuning means disposed in said degenerative feedback loop and being tunable over the operational frequency range of said surface wave delay line filter for selecting a frequency of oscillation corresponding to one of said narrow band resonant peaks included in the amplitude response of said surface wave delay line filter, thereby determining the oscillation frequency of the variable frequency oscillator, and control means operably associated with said tuning means for regulating said tuning means to select a frequency of oscillation corresponding to said one narrow band resonant peak included in the amplitude response of said surface wave delay line filter in response to a digital frequency select input signal, said control means comprising:

a second amplifier having an output connected to said tuning means, a second regenerative feedback loop electrically coupling the output of said second amplifier to the input thereof, a capacitor disposed in said second regenerative feedback loop, a first switch connected across said capacitor, a constant current source connected to the input of said second amplifier, a second switch interposed between said constant current source and said second amplifier for controlling the connection therebetween, automatic level control means connected to the output of said first amplifier and having an output connected to the input of said second amplifier, logic circuit means including switch control means operatively connected to said first and second switches, an output level control loop in which said automatic level control means and said logic circuit means are disposed, a pulse counter disposed in said output level control loop between said automatic level control means and said logic circuit means, said pulse counter being responsive to an output from said automatic level control means to increment the count therein, said logic circuit means being coupled to the output of said pulse counter for sensing the count therein, and said logic circuit means being operable to actuate said switch control means for regulating the closing of said first and second switches to provide an output from said second amplifier to said tuning means for adjustment thereof until the count of said pulse counter is in agreement with the number represented by the digital frequency select input signal.

9. A variable frequency oscillator comprising:

a broadband amplifier operatively responsive to a source for producing an electrical output, a regenerative feedback loop electrically coupling the output of said amplifier to the input thereof, an acoustic surface wave delay line multi-resonant filter disposed in said feedback loop and having an amplitude response containing a plurality of narrow band resonant peaks, tuning means disposed in said feedback loop between said surface wave delay line filter and the input of said amplifier and being tunable over the operational frequency range of said surface wave delay line filter for selecting a frequency of oscillation corresponding to one of said narrow band resonant peaks included in the amplitude response of said surface wave delay line filter, and control means operably associated with said tuning means for regulating said tuning means to select a frequency of oscillation corresponding to said one narrow band resonant peak included in the amplitude response of said surface wave delay line filter in response to a digital frequency select input signal, said control means including logic circuit means for receiving a digital frequency select input signal and being electrically coupled to said tuning means for varying the selection by said tuning means of the frequency of oscillation so as to correspond to any one of said plurality of narrow band resonant peaks included in the amplitude response of said surface wave delay line filter, automatic level control means connected to the output of said broadband amplifier, an output level control loop in which said automatic level control means and said logic circuit means are disposed, a pulse counter disposed in said output level control loop between said automatic level control means and said logic circuit means, said pulse counter being responsive to an output from said automatic level control means to increment the count therein, said logic circuit means being coupled to the output of said pulse counter for sensing the count therein, and said logic circuit means being operable to adjust said tuning means until the count of said pulse counter is in agreement with the number represented by the digital frequency select input signal, thereby determining the oscillation frequency of the variable frequency oscillator.

* * * * *